United States Patent [19]

Stauers

[11] Patent Number: 4,465,968
[45] Date of Patent: Aug. 14, 1984

[54] METHOD AND APPARATUS FOR TESTING OPEN COLLECTOR ELECTRICAL CIRCUIT DEVICES

[75] Inventor: Olgerts Stauers, Lakewood, Colo.

[73] Assignee: AT&T Technologies, Inc., New York, N.Y.

[21] Appl. No.: 321,154

[22] Filed: Nov. 13, 1981

[51] Int. Cl.³ .............................................. G01R 15/12
[52] U.S. Cl. ................................................ 324/73 R
[58] Field of Search .............. 324/73 R, 73 PC, 158 F

[56] References Cited

U.S. PATENT DOCUMENTS

| | | | |
|---|---|---|---|
| 4,063,121 | 12/1977 | Bartlett | 309/311 |
| 4,180,203 | 12/1979 | Masters | 324/73 R X |
| 4,244,048 | 1/1981 | Tsui | 324/73 R X |
| 4,342,959 | 8/1982 | Skilling | 324/73 R X |

OTHER PUBLICATIONS

Millman et al., "Pulse Digital and Switching Waveforms", 1965, McGraw Hill, pp. 322-323.

Data Sheet–"41EG Integrated Circuit", Western Electric, Sep. 1974, pp. 1–5.

Primary Examiner—Gerard R. Strecker
Assistant Examiner—Warren S. Edmonds
Attorney, Agent, or Firm—R. F. Kip, Jr.

[57] ABSTRACT

A method and apparatus for testing a plurality of electrical circuit devices (100a ... 100n FIG. 4) to determine individual device failures wherein the input, (110–117) output (118–121) and power leads (130) of each device are interconnected with corresponding input, output and power leads of the other devices to form common input, output and power leads. The ground lead (140 ... 140n) from each device is individually connected with test apparatus (102). Test signals are introduced onto the common input (110–117), output (118–121) and ground leads (130) and signals, responsive to the test signals, are monitored on the individual ground leads (140 ... 140n) by test apparatus 102 to determine individual device failure.

4 Claims, 4 Drawing Figures

METHOD AND APPARATUS FOR TESTING OPEN COLLECTOR ELECTRICAL CIRCUIT DEVICES

TECHNICAL FIELD

This invention relates generally to methods and apparatus for testing electrical circuits and more particularly to methods and apparatus for testing a plurality of open collector circuit devices.

BACKGROUND OF THE INVENTION

Integrated circuit devices, each of which contain a plurality of logic circuits (inverters, gates, flip-flops, etc.) composed of semi-conductor elements (resistors, diodes, transistors, etc.) are tested for early life failures prior to their end use in particular circuit applications. Such a test typically comprises a burn-in process wherein devices are subjected to required test parameters for a period of time often in an austere environment such as in an elevated temperature chamber. The test progress is constantly monitored and the results recorded. A device under test is usually discarded whenever any semi-conductor element on it fails.

Since the required burn-in test period is typically two or more hours and the test facilities expensive, it is expedient that a large number of devices be tested at the same time by the same facility. Normally, each individual device has its input and output leads individually connected to the test set independently of all other devices; and only the power and ground connections are common or shared among all devices. Test signals are introduced on the individual input leads and the output signals on the output leads are monitored to determine if these signals deviate from predetermined ranges of values which deviant signals indicate a malfunctioning device.

Since integrated circuits have a plurality of input and output leads, a small test facility testing 1000 integrated circuits could require in excess of 12,000 wires interconnected between the devices under test and the facility. As is readily apparent, the large number of required test connections severely limit the number of devices which can be physically located in a test unit while also requiring excess operator time in setting up the test apparatus and add to the chances that an improper test connection may be made thereby causing invalid test data.

Multiplex equipment is also required in most test facilities since the test facility is unable to simultaneously monitor response signals appearing on the output leads for all 1000 circuits under test at the same time. The multiplex equipment switches connecting between the test facility and groups of the 1000 circuits, say fifty circuits at a time, in a preselected sequence to test the 1000 circuits fifty at a time.

There is, therefore, a need for a test method and apparatus for testing a plurality of electrical devices without the need for a large number of electrical interconnections and associated multiplex equipment between the devices and the test apparatus.

SUMMARY OF THE INVENTION

The foregoing problem is solved by test methods and apparatus wherein each of the input, output and power leads of a device under test are individually connected with the test apparatus and interconnected with each corresponding input, output and power lead of the other devices to be tested to form common input, output and power lead connections. The ground lead of each device is individually connected with the test apparatus. Electrical signals are then introduced on the input, output and power leads and the signals appearing on the individual ground leads are monitored to determine device failure.

In a preferred embodiment the value of the signals monitored on the ground leads are automatically compared with ranges of expected values and when the comparison fails the device associated with the ground lead on which the level was monitored is removed from further testing.

BRIEF DESCRIPTION OF THE DRAWINGS

Other features and advantages of the invention, its organization, construction and operation will be best understood from the following detailed description of a specific embodiment thereof, taken in conjunction with the accompanying drawings in which.

DETAILED DESCRIPTION

In a typical prior art burn-in test method groups of the devices to be tested are connected through multiplex equipment with a test apparatus for a period of time during which test signals are transmitted on individually connected input leads and response signals are monitored on individually connected output leads for each device. The monitored response signals indicate when a device under test fails.

Figure 1:
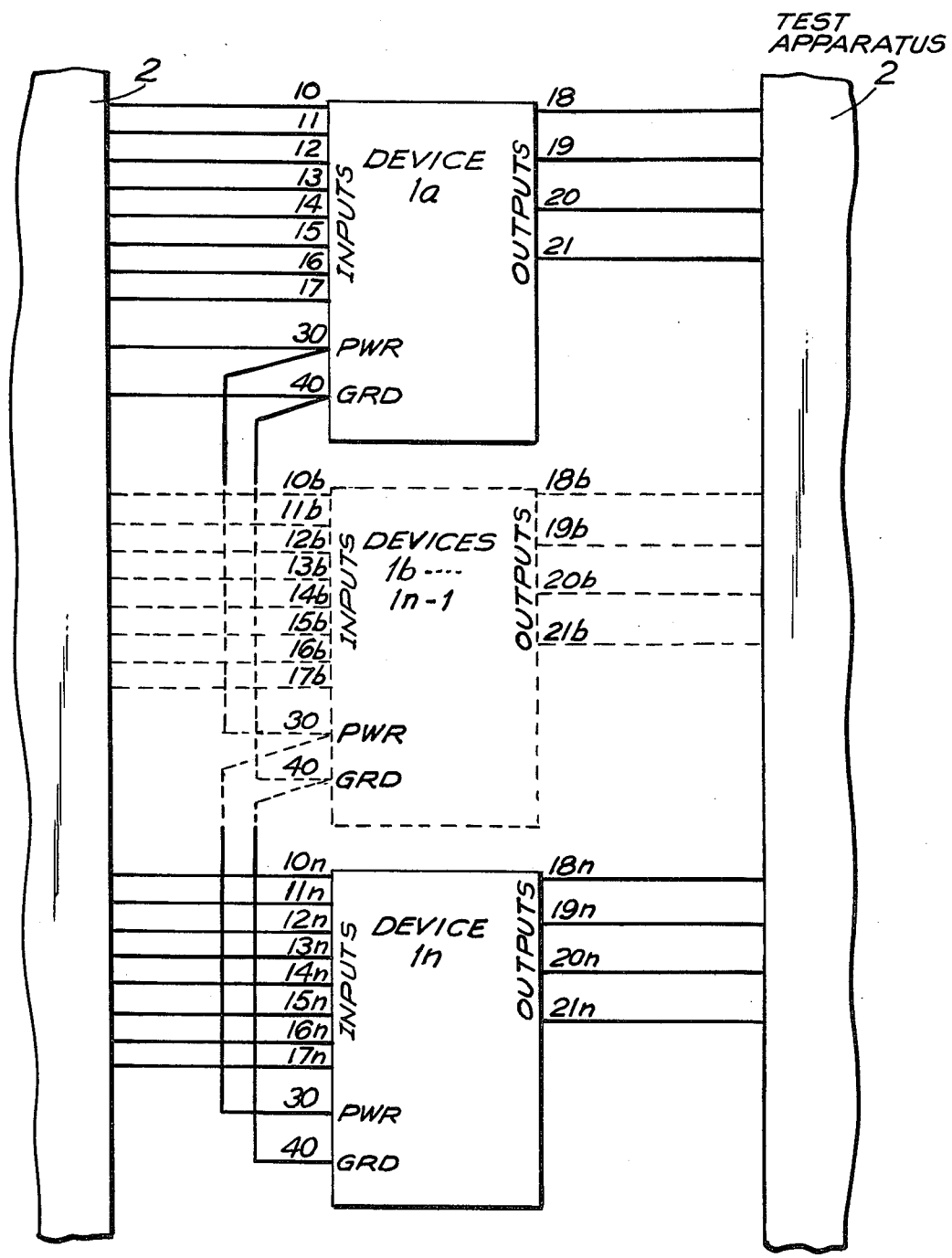
FIG. 1 depicts the wiring connection of a prior art test arrangement for testing a plurality of electrical devices.

FIG. 1 represents a wiring diagram of the above mentioned prior art test system having a plurality of similar integrated circuits, or devices, 1a . . . 1n interconnected with test apparatus 2, which includes multiplex equipment not shown. In FIG. 1 the first device 1a and the last device 1n of the devices under test are shown in detail. The remainder of the devices under test are represented by dotted lines and designated "DEVICES 1b . . . 1n-1" and in actual test arrangements of this type more than 1,000 devices are tested.

Since each of the devices under test is similar, a description of one device will apply equally to all. Device 1a has eight input leads 10-17, four output leads 18-21, a battery lead 30 and a ground lead 40. The eight input leads and four output leads are individually connected to test apparatus 2. Battery lead 30 and ground lead 40 are each connected between device 1a and test apparatus 2 but the leads are then individually connected to the other 1b . . . 1n devices in a multiple fashion such that there is one common battery connection 30 and one common ground connector 40 for all the devices 1a . . . 1n.

The devices 1a . . . 1n are typically electrical devices such as integrated circuits and can have any number of input, output and power leads. A test apparatus known as the 3010 Logic Test Set manufactured by the Fluke Trendar Corp., of Mountain View, Calif. can be used as test apparatus 2 and has the capability of testing 1000 devices with the aid of multiplex equipment.

When performing a test on devices 1a . . . 1n, test apparatus 2 transmits test signals on each of the eight input leads 10 . . . 17 associated with each device 1a . . . 1n and also monitors the response signals received on the individual output leads 18 . . . 21 of each device. A range of values for the response signals has already been determined and if any response signal falls outside of this range the deviant response signal is considered to have been generated by a malfunctioning device. If, for instance, a signal received on lead 19n is not within the predetermined range of values, device 1n is considered to have failed the test and device 1n is removed for repair or is scrapped.

Thus in the prior art test system shown in FIG. 1 if 1000 devices 1-1, . . . 1-1000 are to be tested by test apparatus 2, the system would require 12,002 leads to be connected between the devices and the test apparatus, 12,000 leads for the 12 individual input and output leads of each device 1a . . . 1n and two leads for the common ground 40 and battery 30 connections.

Additionally, multiplex equipment (not shown) switches connections between the 1,000 devices and test apparatus 2 such that at any one time only a specific group (i.e. devices 1-1 to 1-50) are connected with test apparatus 2 since the test apparatus is not capable of monitoring the response signals appearing on the 4,000 output leads of the 1,000 devices being simultaneously tested. Typically the devices are tested in groups of fifty in a preselected sequence with the multiplex equipment switching the interconnections between groups of fifty circuits and test apparatus 2.

Figure 2:
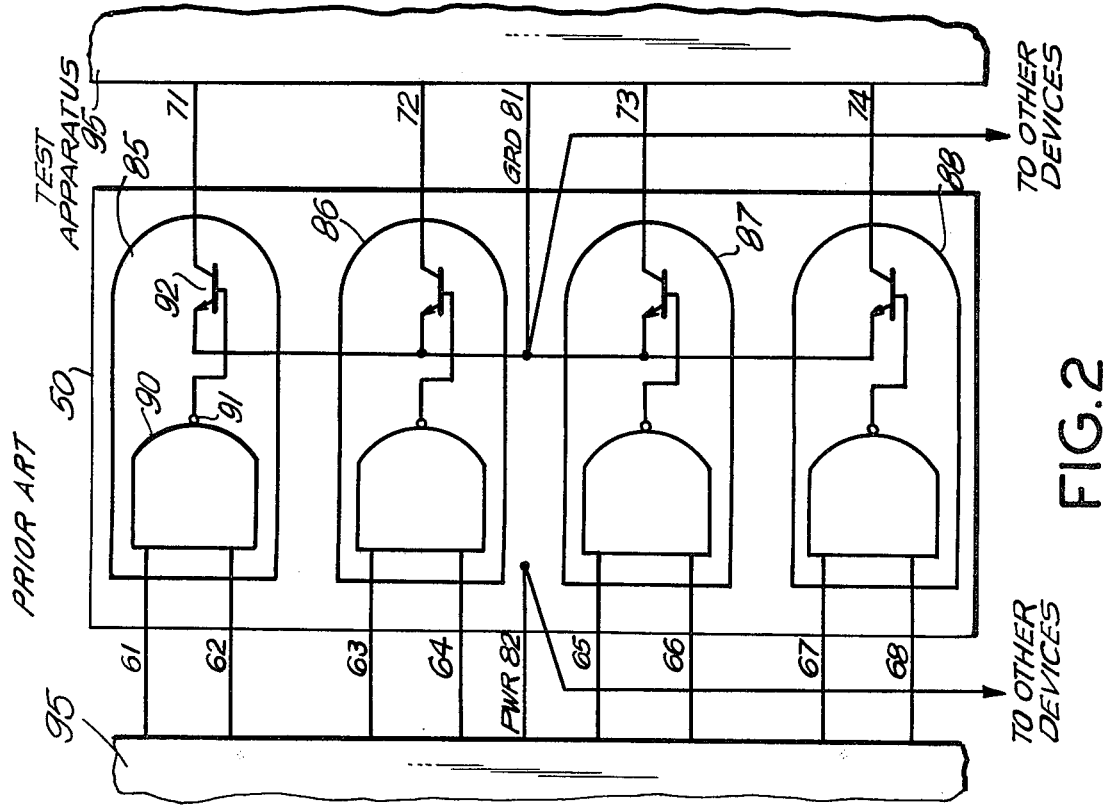
FIG. 2 is a schematic drawing shows the wiring connection for a single device using a prior art arrangement.

FIG. 2 shows a typical integrated circuit device 50, a 41EG integrated circuit manufactured by the Western Electric Co., Inc. of New York, N.Y., which is wired for testing according to the prior art arrangement described above. As seen in FIG. 2, device 50 has eight input leads 61-68, four output leads 71-74, a ground lead 81 and a power lead 82, and comprises four similar logic circuits 85-88 interconnected together as shown with each logic circuit comprising an AND gate 90, an inverter 91 and a transistor 92.

Table 1, shown below, is a portion of the "Truth Table" representing the expected output signals on each of the output leads 71-74 when particular signals are impressed on input leads 61-68. With eight input leads, device 50 actually has a Truth Table showing 256 combinations of input "0"s and "1"s and the expected responsive "0" and "1" output signals. However Table 1 shown below lists only a proportional representation of the 256 combinations since the listed representation is sufficient to clearly explain the operation of device 50 as it relates to the test method described herein.

In Table 1, "0" represents signals having no positive values including zero value or a signal having a negative value; "1" represents a signal having a positive value; and "X" indicates that the signal appearing on the lead is irrelevant in that its value, either "0" or "1", will not affect the other associated signals shown on that line in the Truth Table—in other words a "0" or a "1" could appear on the input lead or the output lead represented by an "X" and the other "0"s and "1"s would not be affected. For instance, Line 2 of Truth Table 1 shows that when a "0" signal appears on each input lead 61 and 62, a "0" will appear on output lead 71 regardless of what signals are impressed on the remaining input leads 63-68 represented by an "X". A review of Truth Table 1 shows that when combinations of signals are impressed on particular sets of input leads, specific signals are expected to appear on particular output leads and any deviation from the expected output signals during a test would indicate a malfunction of device 50.

For instance, when a "1" is impressed on each of the input leads 61 and 62 of device 50, a "1" is expected to appear on output lead 71 as is shown on line 5 of Truth Table 1. If a "0" instead of a "1" appears on output lead 71 during the test, this deviant response signal indicates that device 50 has malfunctioned and must be either repaired or discarded.

TABLE 1

| LINE | INPUTS | | | | | | | | OUTPUTS | | | |
|---|---|---|---|---|---|---|---|---|---|---|---|---|
|  | 61 | 62 | 63 | 64 | 65 | 66 | 67 | 68 | 71 | 72 | 73 | 74 |
| 1 | 0 | 0 | 0 | 0 | 0 | 0 | 0 | 0 | 0 | 0 | 0 | 0 |
| 2 | 0 | 0 | X | X | X | X | X | X | 0 | X | X | X |
| 3 | 0 | 1 | X | X | X | X | X | X | 0 | X | X | X |
| 4 | 1 | 0 | X | X | X | X | X | X | 0 | X | X | X |
| 5 | 1 | 1 | X | X | X | X | X | X | 1 | X | X | X |
| 6 | 1 | 1 | 1 | 1 | 1 | 1 | 1 | 1 | 1 | 1 | 1 | 1 |

Thus in order to test device 50 as shown in FIG. 2, power is connected to lead 82; ground is connected to lead 81; input leads 61-68 are individually connected with a test circuit 95 for impressing test signals on each of these leads; and output leads 71-74 are individually connected to test circuit 95 for monitoring the response signals appearing on the output leads to determine if device 50 is operating properly according to the expected signal values shown in Table 1.

Figure 3:
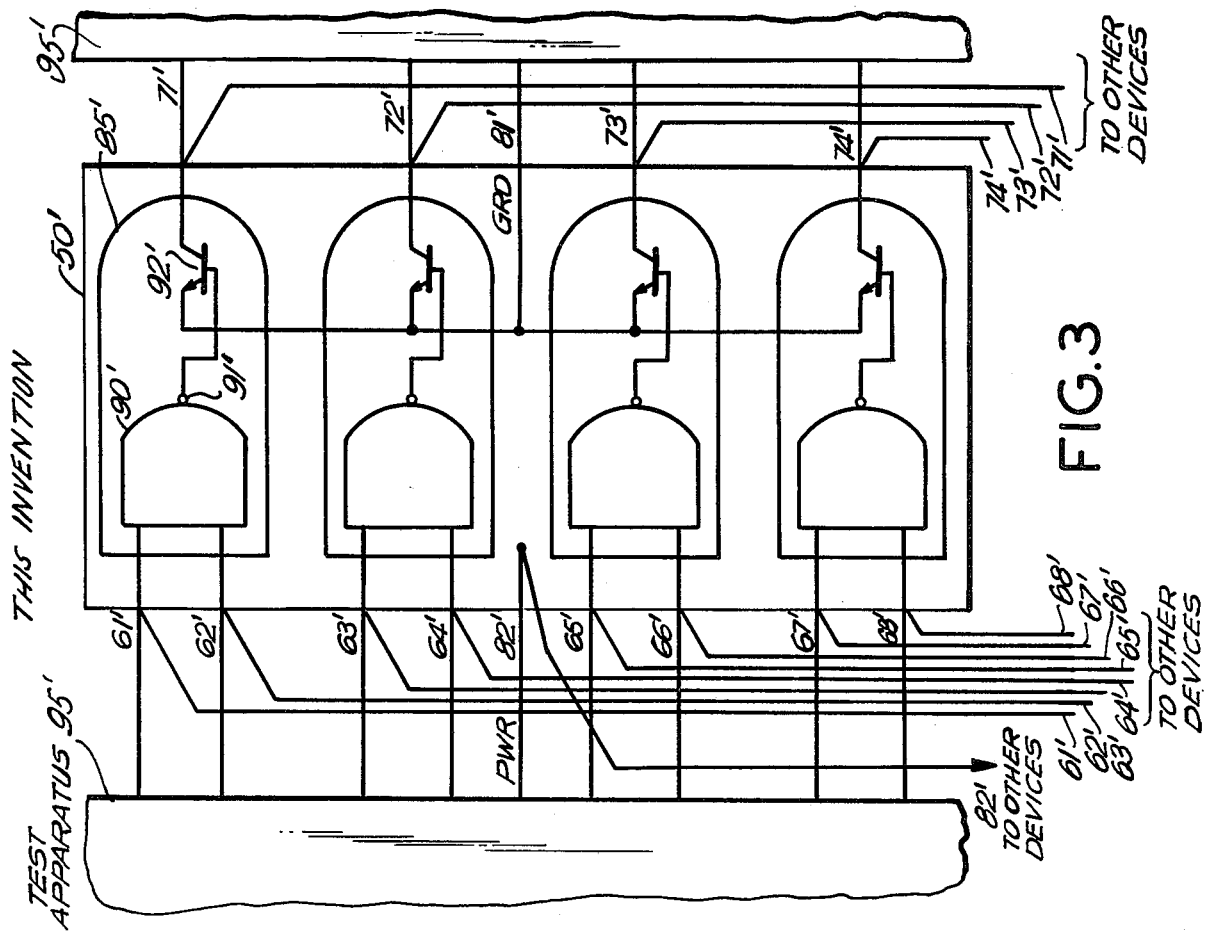
FIG. 3 is a schematic drawing shows the wiring connection for a single device using the present invention.

When device 50 is interconnected as seen in FIG. 3, the device can still be properly tested but only one lead, the ground lead, need be monitored. FIG. 3 shows device 50 of FIG. 2 as device 50' arranged in a test configuration using the present invention. Input leads 61'-68' are individually connected to test circuit 95'; power lead 82' is connected to a power supply through test circuit 95'; output leads 71'-74' are connected to test circuit 95' and are considered as input leads during the test procedure since test signals will be transmitted by test apparatus 95' to device 50' over these leads; and ground lead 81' is connected to test circuit 95' for monitoring the signals appearing on that lead to determine whether or not device 50' is operating properly.

Input leads 61'-68', output leads 71'-74' and power lead 82' are also interconnected with other devices under test as is seen in FIG. 3. Thus the individual input, output and power leads will be common to all the devices under test and ground lead 81' of each device is individually connected between each device under test and test circuit 95'.

Table 2 shown below which is only a portion of the actual Truth Table for circuit 50', lists the signals which would be expected to be monitored on ground lead 81' when particular signals are transmitted from test circuit 95' to device 50' on individual input leads 61'-68' and on individual output leads 71'-74'. For instance, if a "0" test signal is placed on input leads 61' and 62', and a "0" test signal is placed on lead 73' as seen on Line 2 of Table 2; a "O)" response signal will appear on ground lead 81' if circuit 50' of FIG. 3 is operating properly. Thus only the single ground lead of integrated circuit device 50' under test is monitored to determine the operation of device 50' as seen in FIG. 3, as compared with individually monitoring four output leads 71-73 of circuit 50 seen in FIG. 2.

TABLE 2

| LINE | TEST INPUTS | | | | | | | | | | | | MONITOR GROUND 81' |
|---|---|---|---|---|---|---|---|---|---|---|---|---|---|
| | 61' | 62' | 71' | 63' | 64' | 72' | 65' | 66' | 73' | 67' | 68' | 74' | |
| 1 | 0 | 0 | 0 | 0 | 0 | 0 | 0 | 0 | 0 | 0 | 0 | 0 | 1 |
| 2 | 0 | 0 | X | X | X | X | X | X | 0 | X | X | X | 0 |
| 3 | 0 | 1 | X | X | X | X | X | X | 0 | X | X | X | 0 |
| 4 | 1 | 0 | X | X | X | X | X | X | 0 | X | X | X | 1 |
| 5 | 1 | 1 | X | X | X | X | X | X | 0 | X | X | X | 0 |
| 6 | 1 | 1 | 1 | 1 | 1 | 1 | 1 | 1 | 1 | 1 | 1 | 1 | 1 |

Figure 4:
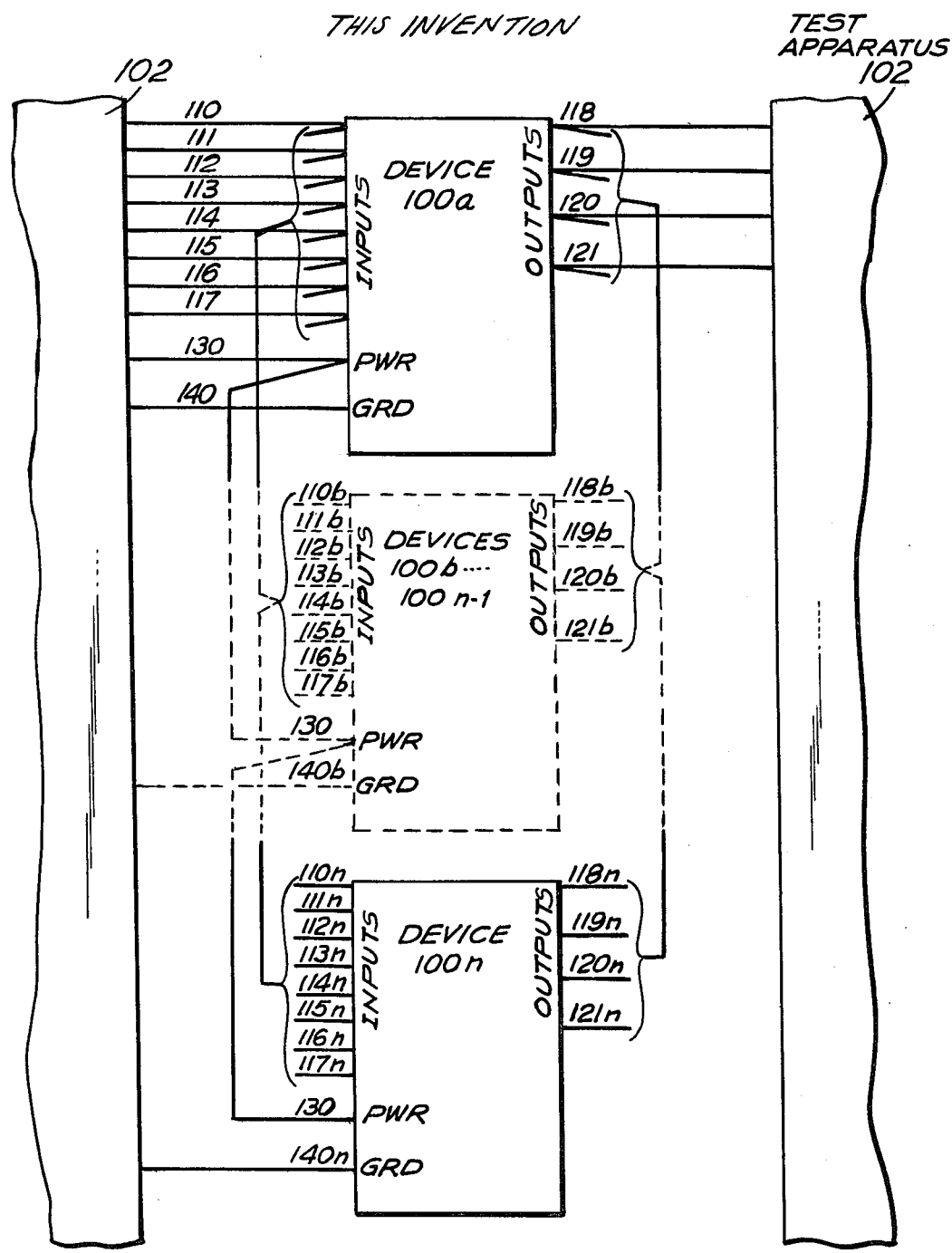
FIG. 4 depicts the wiring connection of a test arrangement for a plurality of electrical devices embodying the present invention.

FIG. 4 shows a plurality of devices $100a \ldots 100n$, connected similar to device 50' of FIG. 3 for testing according to the present invention. Devices $100a \ldots 100n$ are interconnected with test apparatus 102 such that input leads 110-117 of device $100a$ are individually connected with test apparatus 102, but each input lead 110-117 of device $100a$ is then individually connected to the corresponding input lead of the remaining devices $100b \ldots 100n$ in a multiple fashion such that there are eight common input leads 110-117 for all the devices $100a \ldots 100n$. Similarly, the four output leads 120-123 of device $100a$ are individually connected with test apparatus 102 and are individually connected with each of the remaining devices under test to form four common output leads 120-123 among all the devices $100a \ldots 100n$. Power lead 130 is also connected from device $100a$ to test apparatus 102 and connected in a parallel circuit arrangement to all the other devices to form a single common power lead among all the devices $100a \ldots 100n$. As seen in FIG. 4 the ground leads $140, 140b \ldots$, and $140n$ are individually connected from each device under test to test apparatus 102 to monitor the signals appearing on these leads for determining individual device operation.

During test procedures test signals are transmitted from test apparatus 102 over common input leads 110-117, common output leads 120-123 and common power lead 130 to all the devices $100a \ldots 100n$ under test. Signals, responsive to the transmitted test signals, appear on individual ground leads $140 \ldots 140n$ connected between each device $100a \ldots 100n$ and test apparatus 102 and are monitored by test apparatus 102 for comparing the response signals with the response signals listed in Table 2 to determine individual device failures. For instance, if all "1s" are transmitted on input leads 110-121, "1s" should appear on leads 140, $140b \ldots 140n-1$ as would be expected from line 6, Table 2. However, a "0" appearing on ground lead $140n$ is an indication to test apparatus 102 that device $140n$ is not operating properly since the expected response signal is a "1". Device $140n$ would then be removed to be repaired or scrapped.

Test apparatus 102 typically is computer controlled and has stored in its memory the expected response signals as seen in Table 2. As the test procedure is being conducted, the actual response signals received on ground leads $140 \ldots 140n$ are compared with the stored expected response signals to automatically indicate a malfunctioning device when a deviant response signal is received.

In the test arrangement of FIG. 4, if 1000 devices $100_1 \ldots 100_{1000}$ are tesed only 1013 leads are interconnected between test apparatus 102 and devices $100_1 \ldots 100_{1000}$; 1000 leads for the individual ground leads 140 for each device and 13 common leads for the eight input leads 110-117, four output leads 118-121 and power lead 130. As in readily seen, the 1013 interconnecting leads between the devices under test and test apparatus of FIG. 4 is substantially less than the 12,001 leads required by the prior art arrangement shown in FIG. 1 for the same number of devices.

Furthermore, since the response signals on only 1,000 ground leads have to be monitored by test apparatus 102, no multiplex equipment is required.

It will be apparent that one skilled in the art may make various modifications and changes to the methods and apparatus disclosed herein without departing from the spirit and scope of this invention.

What is claimed is:

1. A method of testing a plurality of open collector electrical circuit devices to determine individual open collector electrical circuit device failure wherein each device has a number of individual input and output leads, a power lead and a ground lead, the method comprising the steps of:
    (a) interconnecting each output lead of an open collector electrical circuit device of the plurality of said devices to the corresponding output lead of every other of the plurality of said devices to form a number of common output lead connections among the plurality of said devices;
    (b) interconnecting each input lead of an open collector electrical circuit device of the plurality of said devices to the corresponding input lead of every other of the plurality of said devices to form a number of common input lead connections among the plurality of said devices;
    (c) interconnecting the power lead of an open collector electrical circuit device of the plurality of said devices to the power lead of every other of the plurality of said devices to form a common power lead connection among the plurality of said devices;
    (d) applying test signals to the common input and output lead interconnections; and
    (e) monitoring signals, responsive to the applied test signals, which responsive signals appear on the individual ground leads to determine individual electrical circuit device failures.

2. A method as recited in claim 1 wherein the step of applying test signals comprises:
    applying timed sequences of voltage signals comprising no positive voltage and positive voltage signal levels to the common input and output interconnections.

3. A method as recited in claim 1 wherein the monitoring step comprises:
    monitoring the signal levels on each of the ground leads;
    comparing the monitored signal levels with expected signal levels; and wherein the method further comprises the step of:

removing an open collector eletrical circuit device from the plurality of said devices when the monitored signals on the ground lead individual to said devices do not compare with the expected signal levels.

4. Apparatus for testing a plurality of open collector electrical circuit devices for determining individual device failure wherein each device has a number of input and output leads, a power lead and a ground lead, the apparatus comprising:

means for interconnecting each of the input and output leads of an open collector electrical circuit device to be tested with the corresponding input and output lead of every other open collector electrical circuit device of the plurality of said devices to form a number of individual common input and output lead connections among the plurality of said devices;

means for forming a common power lead interconnection with the power lead for each said device of the plurality of said devices; and test apparatus, interconnecting with the common input and output leads, and the power lead, comprising means for transmitting test signals over the common input and output leads, and power to the power lead; and means for monitoring the response signals on the individual ground leads to determine individual open collector electrical circuit device failures.

* * * * *